United States Patent
Czeczka et al.

(10) Patent No.: US 7,025,867 B2
(45) Date of Patent: Apr. 11, 2006

(54) DIRECT ELECTROLYTIC METALLIZATION ON NON-CONDUCTING SUBSTRATES

(75) Inventors: Regina Czeczka, Gross Glienicke (DE); Lutz Stamp, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 0 days.

(21) Appl. No.: 10/472,374

(22) PCT Filed: May 13, 2002

(86) PCT No.: PCT/EP02/05250

§ 371 (c)(1),
(2), (4) Date: Sep. 17, 2003

(87) PCT Pub. No.: WO02/095091

PCT Pub. Date: Nov. 28, 2002

(65) Prior Publication Data

US 2004/0112755 A1   Jun. 17, 2004

(30) Foreign Application Priority Data

May 18, 2001 (DE) ................. 101 24 631

(51) Int. Cl.
- *C25D 5/54* (2006.01)
- *C25D 5/56* (2006.01)
- *C25D 5/02* (2006.01)
- *C25D 5/34* (2006.01)

(52) U.S. Cl. ............ 205/159; 205/162; 205/164; 205/125; 205/210

(58) Field of Classification Search ........... 205/159, 205/162, 164, 125, 210
See application file for complete search history.

(56) References Cited

U.S. PATENT DOCUMENTS

| | | | | |
|---|---|---|---|---|
| 5,106,473 A | * | 4/1992 | Whitlaw et al. | 205/150 |
| 5,403,467 A | * | 4/1995 | Jonas et al. | 205/125 |
| 5,415,762 A | * | 5/1995 | Allardyce et al. | 205/166 |
| 5,447,824 A | | 9/1995 | Mutsaers et al. | 430/315 |
| 5,575,898 A | | 11/1996 | Wolf et al. | 205/125 |
| 6,007,824 A | | 12/1999 | Duckett et al. | 424/195.1 |

FOREIGN PATENT DOCUMENTS

| | | |
|---|---|---|
| DE | WO 91/08324 | 6/1991 |
| DE | 9017668 | 9/1991 |
| DE | 199 03108 A1 | 8/2000 |
| EP | WO 89/08375 | 9/1989 |
| EP | 0 457 180 A2 | 11/1991 |
| EP | 0 581 823 B1 | 11/1992 |
| EP | 0 731 192 A1 | 9/1996 |
| JP | 07179578 A | 7/1995 |

OTHER PUBLICATIONS

Bressel, et al., " Handluch der Leiterplattentechnik" vol. 3 (1993) Hermann, pp. 80-89.

* cited by examiner

*Primary Examiner*—Edna Wong
(74) *Attorney, Agent, or Firm*—Frank J. Bonini, Jr.; John F. A. Earley, III; Harding, Earley, Follmer & Frailey

(57) ABSTRACT

The invention relates to a method for the direct electrolytic metallization of electrically non-conducting substrate surfaces comprising bringing the substrate surfaces into contact with a water-soluble polymer; treating the substrate surfaces with a permanganate solution; treating the substrate surfaces with an acidic aqueous solution or an acidic microemulsion of aqueous base containing at least one thiophene compound and at least one alkane sulfonic acid selected from the group comprising methane sulfonic acid, ethane sulfonic acid and ethane disulfonic acid; electrolytically metallizing the substrate surfaces.

20 Claims, No Drawings

DIRECT ELECTROLYTIC METALLIZATION ON NON-CONDUCTING SUBSTRATES

This application is a 371 National Stage Application of PCT/EP02/05250 filed on May 13, 2002.

The invention relates to a method for the direct electrolytic metallization of electrically non-conductive substrate surfaces that makes use of a solution or microemulsion comprising polymers of thiophene compounds. The method may more specifically be utilized to manufacture printed circuit boards and other circuit carriers. It is particularly suited to metallize through holes of a very small diameter in printed circuit boards and circuit carriers.

Electroplating methods are being utilized for producing circuit lines and other electrically conductive areas on printed circuit boards or other circuit carriers. Using these methods, the circuit lines and other electrically conductive areas are made from copper. For this purpose for some time, direct electrolytic methods have been utilized, the method involving direct deposition of the copper layer on the electrically non-conductive substrate surfaces by electrolytic means without making use of electroless metal-plating. The non-conducting substrates are made e.g., from epoxy resin.

For many years improvements have been repeatedly suggested, the basic principle of which always is to at first form an electrically conductive base layer on the substrate surfaces and to next electrolytically copper-plate the conductive layer. The electrically conductive base layers used are, among others, layers that may be produced by means of colloidal palladium/tin activators that are e.g., also converted to sulfides by post-treatment. Another alternative consists in depositing onto the non-conductive surfaces a base layer in the form of a carbon layer. It has also been proposed to utilize intrinsically conductive polymers that are prepared by oxidation of heterocyclic monomer compounds (Handbuch der Leiterplattentechnik (Manual of PCB technique), vol. 3, ed. Günther Herrmann, published by Eugen G. Leuze, Germany, pages 80–89).

EP 0 731 192 A1 indicates a possibility of forming an electrically conductive coating on the internal walls of bore holes in printed circuit boards. According thereto, the holes of the printed circuit boards are first manufactured and then prepared by removing resin smears, conditioning the walls of the holes and etching the copper surfaces. The substrate is next contacted with a suspension of an electrically conductive polymer. The suspension is preferably prepared in such a manner that it adsorbs well on the conditioned surface of the internal wall. After that, the prepared substrate may be directly electrolytically metal-plated. The electrically conductive polymers used are polyaniline and polypyrrole for example.

A method for manufacturing a pattern of electrically conductive polymers on a substrate surface is described in U.S. Pat. No. 5,447,824. By this method, solutions of aniline or heterocyclic compounds such as furane, pyrrole and thiophene, more specifically of 3,4-ethylene dioxythiophene, are deposited onto the substrate surface together with an oxidizing agent like for example a Fe(III), Cu(II), Ce(IV) and Cr(III) salt or an organic oxidizing agent, dried there and then exposed for example to UV-radiation. A conductive polymer is formed in the unexposed areas whereas the conductivity of the exposed locations remains relatively high.

In another method, the surfaces of printed circuit boards generally consisting of epoxy resin are prepared for the purpose of forming the intrinsically conductive polymer layers in first producing a layer of manganese dioxide on these surfaces. The surfaces coated with said layer of manganese dioxide are then contacted with a solution of a heterocyclic monomer. Furane, pyrrole and thiophene are used as the heterocyclic monomer.

WO 89/08375 A discloses a method comprising first pretreating the substrates in a permanganate solution for example and then contacting the layer of manganese dioxide thus formed on the surfaces with pyrrole, furane, thiophene or derivatives thereof. The surface is next treated with an acidic solution, the conductive polymer layer being formed. The substrate surfaces may then be electrolytically copper-plated.

WO 91/08324 A1 discloses a modified method in which the substrate surfaces are pre-treated with an alkaline permanganate solution, a layer of manganese dioxide being formed. This layer is then contacted with an acidic solution containing monomers or oligomers of furane, pyrrole, thiophene or derivatives thereof. The conductive polymer layer being formed in the process may then be directly copper-plated by electrolytic means.

At first the heterocyclic monomer compound utilized in forming an intrinsically conductive polymer layer was pyrrole. More recently, examples of polymer layers made from thiophene compounds have been given.

U.S. Pat. No. 5,575,898 for example discloses a process by which the internal walls of holes in printed circuit boards are first pre-treated with an alkaline permanganate solution. Next the treated walls are contacted with a microemulsion of a thiophene, and the thiophene layer obtained is oxidized to form an intrinsically conductive polymer layer. For this purpose, the substrate is contacted with an acid. After that, direct copper-plating with electrolytic means may be performed. Alternatively, the acid may be mixed into the thiophene solution so that but one process step instead of two needs to be carried out. This reference however mentions that, under these conditions, the stability of the microemulsion would be inferior so that it would be recommended to treat separately, first with the thiophene compound and then with the acid. The preferred thiophene compound is a 3,4-alkylene dioxythiophene, more specifically 3,4-ethylene dioxythiophene. The microemulsion, which is defined as an emulsion having a droplet diameter of 5–100 nm, is formed by adding to the solution surface-active agents in the form of n-alkyl-$C_8$–$C_{18}$)-sulfonates, n-alkyl-($C_8$–$C_{18}$)-benzene sulfonates, n-alkyl-$C_8$–$C_{18}$)-trimethyl ammonium salts, n-dialkyl-($C_8$–$C_{18}$)-diethyl ammonium salts, n-alkyl-($C_8$–$C_{18}$)-carboxylates, oligoethylene oxide-mono-alkyl ethers ($C_{6-18}EO_{2-30}$), n-alkyl-($C_8$–$C_{18}$)-dimethylamine oxide, n-alkyl-($C_8$–$C_{18}$)-dimethyl phosphine oxides or oligoethylene oxide-monoaryl ether. The microemulsion may furthermore contain alcohols. The acids employed are, among others, polymeric polysulfonic acids, e.g., polystyrene sulfonic acid and polyvinyl sulfonic acids.

Furthermore, U.S. Pat. No. 6,007,866 discloses a method comprising first coating internal walls of holes in printed circuit boards with a layer of manganese dioxide by treating them with an alkaline permanganate solution and next contacting the walls with a microemulsion of 3,4-ethylene dioxythiophene of aqueous base. Finally a conductive polythiophene layer is formed by oxidation by contacting the internal walls with an acid. After that, direct metal-plating by electrolytic means may be carried out. As an acid, polystyrene sulfonic acid, naphthalene-1,5-disulfonic acid and dodecylbenzene sulfonic acid are suggested for example.

EP 0 581 823 B1 discloses another method that makes use of pyrrole and/or derivatives of pyrrole. In this method an acidic alkali permanganate solution is employed for forming the layer of manganese dioxide. The permanganate solution preferably has a pH of 0–6.0. The pH is adjusted by adding sulfonic acid, like for example methane sulfonic acid, sulfosuccinic acid and isethionic acid. In this case, the monomer solution, which contains pyrrole and/or derivatives thereof, is acidified with phosphoric acid and with a buffering additive.

DE 199 03 108 A1 furthermore discloses a method comprising forming the layer of manganese dioxide needed as an oxidizing agent by treatment with an acidic or alkaline permanganate solution. It is mentioned in this document that it proved particularly advantageous to use a 4–8 percent by weight solution of potassium permanganate having a pH between 8 and 10, acceptable results also being obtained with potassium permanganate solutions with other concentrations and pH-values. An example states that the printed circuit boards, with the through holes drilled therein, are immersed into a solution of 70 g/l potassium permanganate and 10 g/l boric acid. The other process steps substantially correspond to those indicated in U.S. Pat. No. 5,575,898, this reference also pointing out that the acid may be used in conjunction with the thiophene derivative. It is suggested to use phosphoric acid as an acid in this case.

EP 0 457 180 A2 discloses a method for metallizing through-holes in printed circuit boards, this method comprising first forming a manganese dioxide layer on the circuit board surfaces and then treating the surfaces with an acidic solution containing pyrrole and methane sulfonic acid. Instead of pyrrole the solution may also contain thiophene. Due to this treatment an electrically conducting polymer layer is formed. This electrically conducting layer may finally be electrolytically metallized. The use of thiophene and also of aniline instead of pyrrole have been discussed in this document to be disadvantageous because those monomers would be more difficult to apply successfully on an industrial scale. For instance, thiophene would have a relatively high toxicity, and both polyaniline and polythiophene films would not be so conductive as the polypyrrole film and so the resulting board could only be metallized with difficulty.

The use of the known methods proved to cause certain problems:
1) The internal walls of holes in printed circuit boards cannot be easily and satisfactorily metal-plated when the holes are extremely small i.e., when they have a diameter of 50–100 μm for example.
2) In parts, the internal walls of the holes may be metal-plated in an almost satisfactory fashion, particularly when the diameter of the holes is larger. In these cases however, reproducibility is not satisfactory.
3) Furthermore, voids are observed sporadically in the metal layer on the internal walls of the holes. The cause could not be ascertained.

It is therefore the object of the present invention to avoid the problems of the known methods and to more specifically find means with which holes in printed circuit boards may be reproducibly metal-plated without voids forming in the subsequently produced metal layer. The method used is more specifically intended to be suited for coating holes with extremely small holes in a uniform and reproducible manner.

Therefore an object of the present invention is to provide a method for the direct electrolytic metallization of electrically non-conducting substrate surfaces.

A further object of the present invention is to provide a method for the direct electrolytic metallization of printed circuit board material.

Another object of the present invention is to provide a method for the direct electrolytic metallization of holes in printed circuit boards.

The method for the direct electrolytic metallization of electrically non-conducting substrate surfaces according to the present invention comprises the following method steps:
a. bringing the substrate surfaces into contact with a water-soluble polymer;
b. treating the substrate surfaces with a permanganate solution;
c. treating the substrate surfaces with an acidic aqueous solution or an acidic microemulsion of aqueous base containing at least one thiophene compound and at least one alkane sulfonic acid selected from the group comprising methane sulfonic acid, ethane sulfonic acid and ethane disulfonic acid;
d. electrolytically metallizing the substrate surfaces.

The permanganate solution is preferably acidic, the pH of the solution preferably ranging from 2.5 to 7, especially preferably from 3.5 to 5.

In order to render the permanganate solution acidic the solution may comprise at least one buffer compound for adjusting the pH-value, said buffer compound being selected from the group comprising phosphoric acid, dihydrogen phosphate and hydrogen phosphate.

Alternatively the permanganate solution may also be alkaline. Under such circumstances the permanganate solution may comprise at least one buffer compound for adjusting the pH-value, said buffer compound being selected from the group comprising boric acid and borate.

The acidic aqueous solution or the acidic microemulsion of aqueous base contains at least one thiophene compound and at least one alkane sulfonic acid selected from the group comprising methane sulfonic acid, ethane sulfonic acid and ethane disulfonic acid. The acid of preference is methane sulfonic acid. As far as a thiophene compound or an alkane sulfonic acid is mentioned to be used in this solution or microemulsion, it stands for both one single thiophene compound or alkane sulfonic acid, respectively, and for several thiophene compounds or alkane sulfonic acids, respectively.

Suited thiophene compounds are characterized by their capability of spontaneously forming an electrically conductive polymer film by reaction with manganese dioxide adsorbed on the non-conductive surface and under the action of alkane sulfonic acid. Moreover, the thiophene compound must not spontaneously polymerize in-situ. Under proper conditions, the thiophene compound is intended to moreover allow the production of an aqueous solution or of a microemulsion of aqueous base.

The concentration of the alkane sulfonic acids may be set by adjusting the pH. The pH in the solution or microemulsion is adjusted in the range of about 0 through about 3, preferably in the range of about 1.5 through about 2.1. The upper concentration limit is determined by the fact that the solution must remain reliably stable against in-situ polymerization of the thiophene compound. For the higher the concentration of the alkane sulfonic acid, the more acidic the solution or the microemulsion and the more the thiophene compound tends to spontaneously polymerize in-situ. The upper concentration limit depends on the nature of the thiophene compound and can therefore not be set at the same level for all of the thiophene compounds. The lower concentration limit also depends on the tendency of the thiophene compound to polymerize; in this case it must be made certain that the polymer film forms readily and rapidly under the influence of the acid by reaction of the thiophene compound with the film of manganese dioxide adsorbed on the substrate surface.

The thiophene compound is preferably selected from the group comprising 3-heterosubstituted thiophenes and 3,4-diheterosubstituted thiophenes. In a more preferred embodiment of the present invention the thiophene compound is selected from the group comprising 3,4-ethylene dioxythiophene, 3-methoxy thiophene, 3-methyl-4-methoxy thiophene and the derivatives thereof. In principle, other thiophene derivatives may also be utilized of course. They are selected in function of the achievable electrical conductivity of the polymer layer, though.

The concentration of the thiophene compound may be adjusted in the range of about 0.001 mol/l through about 1 mol/l and more specifically in the range of about 0.005 mol/l through about 0.05 mol/l.

The acidic solution or microemulsion of aqueous base is utilized in the method for the direct electrolytic metallization of electrically non-conductive substrate surfaces according to the present invention. The method and the solution or microemulsion permit to avoid the problems of known methods:

1. A process sequence is used on the one hand according to which, upon formation, on the electrically non-conductive surfaces, of a layer of manganese dioxide, an intrinsically conductive polymer layer is formed in one single process step. Unlike with many other proposed methods, it is not necessary to wet the non-conductive surfaces with the monomer solution in the first place and to then contact the wetted surfaces of the substrates with an acid. The advantages associated herewith are an abridged process, which reduces its cost, and an improved reproducibility, as the in-situ formation of the polymer layer always proceeds in a reproducible manner without solution, adhering on the non-conductive surfaces, accumulating in certain surface areas and leaving other areas.
2. The walls of holes with even extremely small diameter, e.g. of 50–100 μm, may be easily metal-plated under mass production conditions without the risk of voids occurring in the metal layer.
3. Furthermore, the electric conductivity of the polymer layer formed is extremely high. It is so high that it can be made certain that even the internal walls of narrow, long bore holes in printed circuit boards may be metal-plated in a fast and reliable way.
4. The stability of the solutions and microemulsions of the monomers used for forming the polymer layer is high enough even under the chosen conditions according to the present invention (utilization of an acidic monomer solution or monomer microemulsion). Even with aged solutions and microemulsions it is still possible to produce polymer layers that have a sufficiently high electric conductivity. Even after ageing, the electric conductivity of the polymer layers that may be made with the solutions and microemulsions still amount to a minimum of $(100\ k\Omega)^{-1}$. By contrast, when the monomer solution or monomer microemulsion is aged and when the conditions according to the invention are not adjusted (examples 4, 6, 10–17), the electric resistance clearly exceeds this value.
5. Electroless metal-plating for the purpose of forming a first conductive metal layer is preferably dispensed with.

As a matter of course the acidic solution or microemulsion intended to be used for producing printed circuit boards is required to have a long shelf life before it becomes necessary to prepare a new one. A method by which, in an effort to increase the shelf life, the processing solution or the microemulsion is constantly rejuvenated through considerable overflow and simultaneous completion with fresh solution does not solve this problem. Under these conditions, production interruption in short time intervals would actually be avoided. However, considerable amounts of the relatively expensive chemicals would be used up. Moreover, great amounts of waste water would be generated, which would require costly treatment.

The invention may be applied to the production of printed circuit boards and other circuit carriers, more specifically to the production of hybrid circuit carriers, onto which are mounted both housed and unhoused semiconductor components. The circuit carriers of concern are so-called multichip modules for example, which are generally provided with several planes of circuit lines arranged in several layers and which possibly are in turn mounted on other circuit carriers (mother boards). In the present application, the term printed circuit board designates any such circuit carrier, generally comprising such circuit carriers that serve to receive and electrically contact electronic active or passive components or component groups and to electrically connect said components and component groups to each other and to other components and that are provided with an electrical circuit configuration for making electrical connections. The circuit carriers may thereby not only be conventional, laminated circuit carriers, but also substantially three-dimensional circuit carriers made from plastic for example (so-called three-dimensional printed circuit boards).

A great number of different methods are available to produce the very complex circuit carriers. A variant consists in starting from a copper foil (overall thickness approximately 40–100 μm) coated with a dielectric (resin) (RCC: resin coated copper) and to build thereon the various wiring planes. This may be achieved in that a dielectric plane and a copper layer are alternately deposited for example, electrical connecting paths being formed between the planes by making holes (micro vias of a diameter of 50–150 μm) through the dielectric layer separating the printed circuit planes to be connected and by metallizing the walls of the holes. In a particularly advantageous variant, the holes are made, in the first place, in that holes of a diameter of approximately 150–250 μm are formed in the copper layer at those places where the holes are to be formed (conformal mask). Then, the holes are drilled with a laser in the center of the thus obtained copper free area. The method in accordance with the invention is carried out next to metal-plate the holes and the corresponding surrounding areas.

The solution or microemulsion is aqueous. That is to say that a major part of the solvent forming the solution or the microemulsion is water (at least 50 percent by volume). It may additionally contain other solvents, more specifically organic solvents, such as alcohols, more specifically low aliphatic alcohols, esters and ether esters. According to the corresponding explanations in U.S. Pat. No. 5,575,898, which is herein incorporated by reference, the microemulsion is an emulsion that contains extremely small droplets (of a diameter of 5–100 nm). This is the reason why the microemulsions are optically transparent. They are also thermodynamically stable, which is to say that the microemulsions do not separate into two visible phases for a long time after their production. The droplet diameter is independent of the energy input (mixing operation), with which the hydrophobic phase is emulsified in the hydrophilic phase.

Inasmuch, the explanations and indications disclosed therein are included in this application.

Depending on the nature of the thiophene compound, either a solution or a microemulsion may be formed. If the thiophene compound rather has hydrophobic character, a microemulsion will rather form. With rather hydrophilic compounds, the reverse is true. The presence of a solution or microemulsion can additionally be controlled by adding, on top of water, further organic solvents, these additional solvents acting as solubilizers.

To form a microemulsion, at least one surface-active agent may be contained in the emulsion. When a surface-active agent intended to be used in the solution or microemulsion is mentioned herein, it refers to both one single surfactant and several surfactants. The surfactant stabilizes the emulsion. Particularly suited surfactants are those selected from the group comprising ethoxylate surfactants. The emulsion may for example contain the ethoxylate surfactants also indicated in U.S. Pat. No. 5,575,898. Inasmuch, the explanations and indications disclosed therein are incorporated herein by reference.

The surfactant compounds have a hydrophilic ethoxylate chain and a hydrophobic residue. Surfactants that are particularly suited to stabilize the microemulsion are tristyrene phenol ethoxylates. Compounds with differential lengths of the ethoxylate chain differ with regard to the stabilizing effect. Using these compounds, a microemulsion of thiophene in water is only clear within a certain temperature range, the solution getting turbid through demulsification above an upper limit temperature and below a lower limit temperature. It was found that microemulsions with surfactants having a hydrophobic residue do not demulsify in a temperature range the upper limit being the higher, the longer the ethoxylate chain.

It was surprisingly found that the temperature interval within which no demulsification is observed may be widened by adding mixtures of various surfactants with hydrophobic residue and differential lengths of the ethoxylate chain. The temperature range in which the microemulsion does not tend to demulsify may be particularly widened when a first surfactant with an EO chain length of 30 maximum and a second surfactant with an EO chain length of 35 maximum are being utilized. This observation not only applies for aqueous microemulsions containing thiophene and/or derivatives thereof. This finding also applies for emulsions of compounds that are not or only restrictedly soluble in water.

The surfactant may more specifically be contained in a concentration ranging from about 0.3 g/l to about 250 g/l, preferably from about 1.4 g/l to about 14 g/l.

In addition to the components mentioned, at least one salt of the alkane sulfonic acid may furthermore be contained. When a salt of an alkane sulfonic acid, which is intended to be used in the solution or microemulsion, is mentioned herein, it refers to one single salt of an alkane sulfonic acid, several salts of an alkane sulfonic acid and several salts of several alkane sulfonic acids.

To form the salt of the alkane sulfonic acid, it is preferred to use cations of the salt selected from the group comprising alkali cations, alkaline earth cations, ammonium cations, tetraalkyl ammonium cations, more specifically tetramethyl ammonium cations, furthermore zinc cations, tin cations and aluminum cations. Potassium salts of the alkane sulfonic acid in particular, more specifically potassium methane sulfonate and the corresponding higher homologues, proved to develop a particularly advantageous effect.

The concentration of sulfonate anions originating from the alkane sulfonic acid and from the salt thereof are contained in the solution or microemulsion may be adjusted in the range of about 0.001 mol/l to about 2 mol/l, preferably in the range of about 0.08 mol/l to about 0.8 mol/l. The salt concentration is obtained by subtracting this concentration from the concentration of the alkane sulfonic acid in the solution or microemulsion. The salts may more specifically be contained in a concentration ranging from about 0.001 mol/l to about 2 mol/l.

The salts mentioned may be added to the solution or microemulsion either separately, or a corresponding base, KOH for example, may be added to a solution or microemulsion that contains alkane sulfonic acid in excess.

The solution or microemulsion may furthermore contain wetting agents that have been chosen in function of their capability to reduce as much as possible the surface tension of the solution or microemulsion. Such solutions or microemulsions are particularly suited to treat holes with an extremely small diameter as the inside of the holes may be reached more easily by the solution or microemulsion.

The solution or microemulsion may be advantageously utilized in the process in accordance with the invention. This method permits to deposit in a simple manner a layer of metal onto resin surfaces without using electroless metal-plating.

The process comprises the following process stages:
a. bringing the substrate surfaces into contact with a water-soluble polymer;
b. forming a layer of manganese dioxide on the electrically non-conductive substrate surfaces, using a permanganate solution;
c. treating the substrate surfaces with the thiophene solution or microemulsion,
d. electrolytically metal-plating the substrate surfaces.

In order to form a layer of manganese dioxide on the resin surfaces (step b. of the process), the substrate is contacted with the permanganate solution.

In order to condition the resin surfaces, the substrate is contacted with a water soluble polymer in the first place. The water soluble polymer may be utilized as a cleaner/conditioner liquid which is able to wet, clean and condition the surfaces. The water soluble polymer serves to purposefully deposit manganese dioxide onto the dielectric areas through treatment in the subsequent permanganate solution. Since not only FR4 base materials (flame retardant epoxy resin/glass fiber composite material) have been utilized for some time for producing printed circuit boards, but also laminates with reinforcing materials other than glass fiber, namely materials with woven materials made for example from tetrafluoropolymers, aramide and/or ceramics, and laminates with resin materials having a glass transition temperature $T_g > 140°$ C., e.g., up to 320° C., such water soluble polymers are required that permit secure and uniform formation of the layer of manganese dioxide.

The conditioner contains the water soluble polymer in a concentration preferably ranging from about 20 mg/l to about 10 g/l. The water soluble polymer of preference contained therein may be at least one polymeric amine and more specifically a compound selected from the group comprising polyvinyl amine, polyethylene imine, polyvinyl imidazole and alkylamine ethylene oxide copolymers. The following compounds are also suited to be used as water soluble polymers: polyethylene glycol, polypropylene glycol, copolymers of ethylene glycol and propylene glycol, polyvinyl alcohol, polyacrylates, polyacrylamide and polyvinylpyrrolidone.

Furthermore, and in addition to water, the conditioner may contain a water soluble organic solvent in a concentration ranging from about 10 ml/l to about 200 ml/l, the water soluble organic solvent being more specifically at least one compound selected from the group comprising half ethers and half esters of ethylene glycol, diethylene glycol and triethylene glycol, e.g., diethylene glycol monoethylether. The following solvents are also suited: ethanol, propanol, ethylene glycol, diethylene glycol, glycerine, dioxan, butyrolacton, N-methyl-pyrrolidone, dimethyl formamide and dimethylacetamide. The solvents may be utilized either in pure form or diluted with water.

The conditioner may furthermore contain at least one wetting agent to produce an enhanced wetting effect. Alkyl and aryl ethoxylates are particularly suited.

The conditioner may moreover contain an alkalizing agent. All of the current alkalizing agents may be used, e.g., NaOH, KOH, $NH_3$, $N(CH_3)_4OH$, $CO_3^{2-}$ and $HCO_3^-$.

The substrate is preferably contacted with the conditioner at an elevated temperature, for example at a temperature ranging from about 25° C. to the boiling point of the conditioner, preferably from about 60° C. to about 85° C. Depending on the intensity of fluid convection on the surface to be treated, treatment time amounts to from about 15 sec to about 15 min. The treatment time of preference is chosen from about 2 min to about 6 min when the immersion technique is being used and from about 15 sec to about 2 min when the horizontal technique is employed.

The conditioner not only serves to facilitate subsequent production of the layer of manganese dioxide by means of the permanganate solution but also to simplify wetting of finest holes so that air contained therein may be completely expelled therefrom.

The possibly swollen resin surfaces are next treated with the permanganate solution to form a film of manganese dioxide. An acidic permanganate solution proved particularly suited to form a very compact and only slightly porous layer of manganese dioxide. Such a layer of manganese dioxide permits to achieve reproducible metallization of the resin surfaces in a substantially simpler way than in using alkaline permanganate solutions to form said layers of manganese dioxide. The compact layer of manganese dioxide is obviously much more stable and there is, in the process of treating the substrates, a lesser tendency of the particles of manganese dioxide to detach from the layer, to enter into the solution and to create problems there. In comprehensive tests it was furthermore found that the amount of manganese dioxide formed using an alkaline permanganate solution is much greater than that obtained when using an acidic solution. It appears that during the subsequent formation of the conductive polymer layer the layer of manganese dioxide often is not even entirely used up in favor of the polymer layer. Therefore, residues of manganese dioxide may be found between the polymer layer and the resin surface even after the monomer has reacted with the manganese dioxide. This may result in deficient adherence of the metal layer subsequently applied to the resin surface.

The permanganate solution contains a permanganate salt, more specifically an alkali permanganate salt such as sodium permanganate and/or potassium permanganate for example. The concentration of sodium permanganate in the solution may for example be set to range from about 30 g/l to about 200 g/l, preferably from about 60 g/l to about 100 g/l. If permanganate is utilized in a concentration of up to 50 g/l, the less soluble potassium permanganate may be used. Sodium permanganate is to be preferred at higher concentrations because of its better solubility.

The production of the layers of manganese dioxide using an alkaline permanganate solution results in the generation of manganate ($MnO_4^{2-}$) together with major and uncontrollable formation of sludge ($MnO_2$). Furthermore, the layers of manganese dioxide are very bulky so that a reaction of the layer of manganese dioxide with the monomers used for forming the conductive polymer layer is probably not quantitative. Because of the drawbacks mentioned, the subsequently formed polymer layer is not provided with satisfactory electric conductivity, and problems arise in further steps of the fabrication process of printed circuit boards, more specifically during treatment with acidic solutions containing hydrogen peroxide (in the full pattern plating process for example), which are due to the fact that residual amounts of manganese dioxide are dissolved by the acidic reducing solutions while oxygen is being formed in the process. Defects may thus occur in the electrically conductive layer.

By contrast, in using an acidic permanganate solution to form the layer of manganese dioxide, a grey-brown, dull finish, smallest-sized grained layer of manganese dioxide is formed which is relatively thin but compact and which is perfectly suited therefore to form the polymer layer utilizing the solution or microemulsion. As a result thereof, there is no risk that residues of manganese dioxide are left over when the polymer layer is being formed so that no problems arise in further steps in the fabrication process of printed circuit boards that make use of reducing chemicals. Furthermore, the permanganate solution does not tend to form manganate ($MnO_4^{2-}$) which would in turn decompose (disproportionate) into $MnO_2$ (manganese dioxide). Strong formation of sludge is thus avoided. The acidic permanganate bath is therefore considerably more stable than a corresponding alkaline bath.

It is particularly to be noted that in using an acidic permanganate solution instead of an alkaline solution to form the layer of manganese dioxide, the conductivity of the polymer layer is surprisingly increased by a power of ten.

Permanganate solutions having a pH ranging from about 2.5 to about 7 proved to be particularly suited. The pH is preferably adjusted in the range from about 3.5 to about 5.

As contrasted with the known methods of producing the layer of manganese dioxide by means of an acidic permanganate solution, at least one first buffer compound for adjusting the pH is preferably utilized as a component of the acidic permanganate solution, said buffer compound being selected from the group comprising phosphoric acid, dihydrogen phosphate, preferably alkali dihydrogen phosphate, and hydrogen phosphate, preferably dialkali hydrogen phosphate, alkali standing for lithium, sodium, potassium, rubidium and cesium. These compounds permit to adjust the pH of the permanganate solution to the previously mentioned value of about 2.5 to about 7.0 and more specifically of about 3.5 to about 5.0.

The first buffer compound is contained in the acidic permanganate solution in a concentration preferably ranging from about 1 g/l to about 90 g/l.

The acidic permanganate solution for forming the layer of manganese dioxide may also contain boric acid or borate for adjusting the pH. The concentration of this substance in the etch solution preferably ranges from about 1 g/l to about 20 g/l. If boric acid or borate alone are utilized as a buffer compound and no first buffer compound is used, the pH of the permanganate solution is approximately adjusted to 9. In this case however, the benefits of an acidic permanganate solution are not taken advantage of. Boric acid and borate may also be utilized in combination with the first buffer compound, though.

The acidic permanganate solution may also contain further components like for example a wetting agent for reducing the surface tension of the solution. Fluorinated wetting agents are particularly suited.

The temperature of the acidic permanganate solution is more specifically adjusted to a value ranging from about 55° C. to about 95° C., preferably from about 65° C. to about 90° C.

The treatment time of the substrates in the acidic permanganate solution may range from about 30 sec to about 6 min. When using the immersion technique, the treatment time ranges from about 2 min to about 6 min and when using the horizontal technique, it ranges from about 1 min to about 3 min.

After that the substrate is rinsed and contacted without any further treatment with the acidic monomer solution or microemulsion. The solution is adjusted to a temperature near room temperature i.e., of 25° C. for example. The treatment time in this solution amounts to from about 30 sec to about 5 min, more specifically from about 45 sec to about 2 min, depending on the method chosen.

Then, the substrate is electrolytically metal-plated, more specifically copper-plated.

In principle, the following sequences are conceivable:

If for example a simple printed circuit board material consisting of a glass fiber reinforced epoxy resin (FR4) without internal layers of copper is treated, the following process sequence may be used:
e) conditioning
   rinsing
f) forming the layer of manganese dioxide
   rinsing
g) forming the polymer layer by means of the monomer solution or microemulsion
   rinsing
h) pickling
i) electrolytically metal-plating Process step e) consists in preparing the resin surfaces with the water soluble polymer in an aqueous solution that possibly contains an organic solvent and wetting agents and/or alkalizing agents for subsequent permanganate treatment. The layer of manganese dioxide (step f) and the conductive polymer layer (step g) are formed next as described. After that the printed circuit boards may still be treated with an acidic cleaner like for example an aqueous solution of sulfuric acid and hydrogen peroxide. Then, the exposed copper surfaces are pickled, e.g. by means of a 5 percent by weight solution of sulfuric acid (step h). As indicated, the substrate is preferably rinsed in deionized water between each of the above mentioned process steps in order to remove the sticking residues of solutions left over from the previously performed steps. Three-step rinsing may be carried out between the steps f) and g), the first and third rinsing steps being performed with water and the second step being carried out with an acidic aqueous solution containing sulfuric acid, phosphoric acid and/or methane sulphonic acid for example. The second, acidic, rinsing step permits to remove layers of copper oxide that possibly formed on exposed copper surfaces prior to producing the polymer layer. Finally, the electrically conductive surfaces are electrolytically metal-plated, more specifically copper-plated (process step i).

Instead of a copper-plating bath any other suited metal-plating bath may be utilized such as baths for depositing nickel, tin, zinc, lead, iron, gold, palladium, silver, cobalt, alloys thereof or with other elements. The substrate is preferably electrolytically copper-plated. For this purpose, a sulfuric acid copper-plating bath may be utilized, said bath containing, in addition to copper sulfate and sulfuric acid, small amounts of chloride as well as additives which influence the physical properties of the coating. These are for example brighteners and leveling agents.

For the production of complex circuits such as multilayered printed circuit boards or microvia products, the following process sequence is used:
A) Desmear process:
a) swelling
   rinsing
b) etching with a permanganate solution
   rinsing
c) removing manganese dioxide by reducing
   rinsing
B) Pre-treating:
d) cleaning by etching
   rinsing
C) Producing the conductive polymer (method in accordance with the invention):
e) conditioning
   rinsing
f) forming manganese dioxide
   rinsing
g) forming the conductive polymer
   rinsing
h) pickling
i) electrolytically metal-plating.

In producing complex circuits, resin smear is first removed from the holes by etching (desmear process; step b). For this purpose, the surfaces are etched and/or cleaned depending on the type of the dielectric. Dielectric surfaces may for example be treated with an alkaline, hot solution containing permanganate in order to remove resin smear from drilled epoxy resin regions in holes or corresponding layers in substrates drilled by means of a laser. If the hereby generated manganese dioxide is not intended to be used to subsequently form the conductive polymer layer, it must be removed again from the dielectric surfaces (step c of the process). This treatment may be carried out with a reducing agent such as sulfite salts, hydroxylammonium salts, hydrogen peroxide or other reducing agents, preferably in an acidic solution. For etching the resin surfaces with solutions containing permanganate, they may be treated, prior to etching, with an organic swelling agent (step a) of the process). Current swelling agents may be used for this purpose. Agents for etching resin other than permanganate may be utilized as an alternative e.g., concentrated sulfuric acid, sulfur trioxide or chromic acid as well as a plasma process preferably utilizing an oxidizing plasma gas or a plasma gas containing inert gases such as $CF_4$ and/or Ar. If the dielectric is not formed on the basis of epoxy resin, other etching agents are preferably used, organic solvents containing alkali hydroxide for example for polyamide and a molten salt for example for ceramics, a plasma etching method being used for various other substrate materials because of its universal applicability.

Rinsing is preferably carried out between the process steps mentioned.

The desmear process is followed by pre-treatment. Said pre-treatment consists in cleaning exposed copper surfaces, said copper surfaces being etched and thereby cleaned by means of an acidic hydrogen peroxide solution or a caroate solution or with an acidic peroxodisulfate solution, more specifically with a sodium, potassium or ammonium peroxodisulfate solution (process step d). This step may be dispensed with though when in step c) of the process the copper has sufficiently been cleaned by means of a sulfuric acid hydrogen peroxide solution.

The method of forming the conductive polymer layer comes next. Process step e) of the process again consists in preparing the resin surfaces for the subsequent treatment with permanganate by means of a water soluble polymer in an aqueous solution that possibly contains an organic solvent, wetting agents and/or alkalizing agents. The layer of manganese dioxide (step f) of the process) is formed next, then the conductive polymer layer in the manner described (step g) of the process). Finally, metal is electrolytically deposited. For this purpose, exposed copper surfaces are pickled first, e.g. with a 5 percent by weight sulfuric acid solution (step h) of the process). After that, the electrically conductive surfaces are electrolytically metal-plated, more specifically copper-plated (step i) of the process). As indicated above, water rinsing may be carried out between the process steps. In this case too, three-step rinsing may be performed between the process step f) and g), the respective one of the first and third rinsing steps being carried out with water and the second rinsing step with an acidic aqueous solution.

The method in accordance with the invention may be used both in conventional plating tanks and in so-called horizontal plants in which the printed circuit boards are conveyed in horizontal direction while being contacted with the various processing fluids.

Typical ranges of treatment times in the various processing steps are indicated in Table 6, which differentiates between immersion technique and horizontal transportation method.

The invention will be explained in more detail with the help of the following examples:

EXAMPLES 1–6

Copper-laminated FR4 printed circuit board material, of 1.6 mm thick, with holes drilled therein the diameter of which ranges from 0.5 mm to 0.3 mm was first treated according to the sequence indicated in Table 1A and immediately afterwards, wet in wet, according to the processing sequence indicated in Table 1B.

The electric resistance [kΩ] of the produced polymer layers was measured on 5 cm×5 cm large FR4 printed circuit board sections with a one-sided copper coating. The polymer layer was deposited on the side that had not been coated with copper. The resistance was determined parallel to the polymer surface between two measuring points 1 cm apart.

The compositions of the solutions are in part indicated in the Tables 1A and 1B. Please refer to Table 2 for the compositions of the permanganate baths P1 and P2 and to Table 3 for the compositions of the monomer baths.

The monomer baths M3 and M4 do not correspond to the solutions or microemulsions used in the method in accordance with the present invention. Accordingly, the tests performed with these baths are comparative tests (Examples 3, 4 and 6). Furthermore, the permanganate bath P1 is alkaline and the permanganate bath P2 acidic. As a result thereof, the only example of an optimally performed test is Example 5 in which the permanganate bath P2 was made use of.

Look-up Table 4 shows the following results: It indicates on the one hand the resistance of the conductive polymer layer formed parallel to the surface of the layer. It furthermore indicates the coverage of the internal walls of the holes in the printed circuit board sections, the indication "D10" referring to an excellent (continuous) coverage of a layer of copper electrolytically deposited on the internal walls of the holes whereas the indication "D5" stands for a but moderate coverage.

The following results were obtained:

Example 1

A freshly prepared microemulsion of the invention was contacted with a layer of manganese dioxide that had been formed on the FR4 boards with an alkaline permanganate solution. The thus obtained polymer layer had a very low resistance. Furthermore, the coating coverage of the internal walls of the holes with metal that was achieved after only a relatively short electroplating time (2 min) and at the relatively low current density of 2 A/dm$^2$ was excellent.

Example 2

This outstanding result could also be confirmed with the monomer solution having been in use for five days already.

Example 3

If, after that, instead of the microemulsion of the invention, a microemulsion was used that contained polystyrene sulfonic acid instead of methane sulfonic acid and the potassium salt thereof, the result obtained was also very good with regard to the conductivity of the polymer layer and to coating coverage after copper electroplating.

Example 4

However, the excellent results of Example 3 could no longer be obtained with the monomer emulsion having been in use for five days already.

For the Examples 5 and 6, the acidic permanganate solution P2 was utilized. In Example 5, an aged microemulsion containing methane sulfonic acid in accordance with the present invention was used. Under these conditions, the resistance of the polymer layer could still be lowered by one order of magnitude. The copper coating coverage of the internal walls of the holes was already outstanding after an electroplating time of 1 min.

In performing the same test with the aged monomer solution M4 (Example 6) that contained polystyrene sulfonic acid instead of methane sulfonic acid, the polymer layer obtained only had a moderate electric conductivity. In this case, the resistance of the polymer layer was not observed to drop by using the acidic permanganate solution instead of an alkaline permanganate solution. It may be concluded therefrom that the advantageous effect of the acidic permanganate solution is only obtained when used concurrently the monomer solutions or microemulsions containing an alkane sulfonic acid in accordance with the present invention. The copper coating coverage of the internal walls of the holes also was unsatisfactory.

EXAMPLES 7–17

Further tests were performed to analyze differences in the formation of polymer layers that had been produced with various monomers. In this case, the resistance of polymer layers having been produced with freshly prepared monomer microemulsions on the one hand and of polymer layers having been produced with monomer microemulsions aged for five days on the other hand was determined under the conditions indicated for the Examples 1–6.

The compositions of the individual microemulsions only differed in the nature of the monomer used. In all cases, the concentration of this substance, the pH as well as the surfactant added to the emulsion and the concentration thereof were identical and corresponded to the conditions according to the Examples. 1–6.

The results are summarized in Table 5.

Accordingly that, resistance values of 100 kΩ or less could only be obtained with methane sulfonic acid, ethane sulfonic acid and ethane disulfonic acid both when the monomer bath had just been prepared and when the bath had already been in use for five days. All of the other monomers yielded polymer layers with poorer electric conductivity, at least when the corresponding baths had been aged.

EXAMPLES 18–23

Compositions containing various surfactants were tested in an effort to optimize the temperature stability of a microemulsion containing 3,4-ethylene dioxythiophene. These tests relate to microemulsions which did not contain alkane sulfonic acids and which, for the rest, constitute concentrates of the solutions and microemulsions containing alkane sulfonic acids. Such concentrates are used to prepare the solutions and microemulsions and are diluted for this purpose with water, alkane sulfonic acid and possibly further components being added.

Each microemulsion contained 8 percent by weight of the thiophene derivative in a purely aqueous emulsion. Various tristyrene phenolethoxylates were added to the emulsions. Microemulsions with an ethoxylate chain of ethoxylate compounds with 16, 20, 25 and 40 ethylene oxide-(EO)-monomeric units were produced and analyzed. The concentration of the respective ethoxylate compounds in the microemulsions and the temperature ranges in which the microemulsions were clear are indicated in Table 7.

Table 7 shows that the temperature range in which a microemulsion is clear is the higher, the longer the EO chain. Table 7 also shows that particularly wide ranges of temperature may be obtained when a mixture of surfactants with differential lengths of the EO chains is used.

It is understood that the examples and embodiments described herein are for illustrative purpose only and that various modifications and changes in light thereof and combinations of features described will be suggested to persons skilled in the art and are to be included within the spirit and purview of the described invention and within the scope of the appended claims. All publications, patents and patent applications cited herein are hereby incorporated by reference.

TABLE 1A (Desmear process)

| Process step | Temperature [° C.] | Treatment time [min] |
|---|---|---|
| a) Swelling agent Securiganth* (aqueous solution of an ether ester) Rinsing | 75 | 4 |
| b) Permanganate desmear/ etch solution**) Rinsing | 85 | 10 |
| c) Aqueous sulfuric acid solution of hydrogen peroxide Rinsing | 45 | 1.5 |
| d) Etch cleaner Securiganth C* (aqueous acidic caroate solution) | 25 | 1 |

*)Product of Atotech Deutschland GmbH
**)60 g/l $NaMnO_4$, 45 g/l NaOH, 8 g/l $Na_2MnO_4$

TABLE 2

(Permanganate baths)

| Permanganate bath | Concentration of $NaMnO_4$ [g/l] | Concentration of $H_3BO_3$ [g/l] | Concentration of $H_3PO_4$ [g/l] | pH value |
|---|---|---|---|---|
| P1*) | 80 | 10 | 0 | 8.8 |
| P2*) | 80 | 3 | was added until reaching pH 3.5 | 3.5 |

*)The baths were aged with 3 m² PCB blanks per liter while permanently correcting all the component parts

TABLE 1B (Producing the conductive polymer (method in accordance with the invention))

| Process step | Temperature [° C.] | Treatment time [min] |
|---|---|---|
| e) Conditioner Mix Compact CP* (aqueous solution of a water soluble polymer) rinsing (3 times) | 65 | 1 |
| f) Permanganate solution (see Table 2) Rinsing 1 (with water), rinsing 2 (with phosphoric acid solution pH 2.0), rinsing 3 (with water) | 85 | 1 |
| g) Monomer bath (see Table 3) Rinsing (3 times) | 25 | 1 |
| h) Pickling bath (10 percent by weight $H_2SO_4$) | | |
| i) Electrolytic copper-plating bath Cupracid BL-CT* (sulfuric acid copper bath with sulfurous brightener (current density: 2 A/dm²) | | (See Table 3) |

*)Product of Atotech Deutschland GmbH

TABLE 3

(monomer baths)

| Name of the bath | Bath composition |
|---|---|
| M1 | 0.125 ml/l 3,4-ethylene dioxythiophene in a microemulsion 0.3 mol/l potassium methane sulfonate Addition of methane sulfonic acid up to pH 2.0 3.5 g/l of an ethoxylate surfactant |
| M2 | 0.125 ml/l 3,4-ethylene dioxythiophene in a microemulsion 0.3 mol/l potassium methane sulfonate Addition of methane sulfonic acid up to pH 2.0 3.5 g/l of an ethoxylate surfactant aged 5 days and corrected |
| M3 | 0.125 ml/l 3,4-ethylene dioxythiophene in a microemulsion Addition of polystyrene sulfonic acid up to pH 2.0 3.5 g/l of an ethoxylate surfactant |
| M4 | 0.125 ml/l 3,4-ethylene dioxythiophene in a microemulsion Addition of polystyrene sulfonic acid up to pH 2.0 3.5 g/l of an ethoxylate surfactant aged 5 days and corrected |

TABLE 5

(Test results)

| Example | Sulfonic acid | Resistance with freshly prepared bath [kΩ] | Resistance after ageing [kΩ] |
|---|---|---|---|
| 7 | methane sulfonic acid | 15 | 25 |
| 8 | ethane sulfonic acid | 30 | 100 |
| 9 | ethane disulfonic acid | 15 | 100 |
| 10 | decane sulfonic acid | >500 | >20,000 |
| 11 | naphthalene-1-sulfonic acid | 20 | 120 |

TABLE 5-continued (Test results)

| Example | Sulfonic acid | Resistance with freshly prepared bath [kΩ] | Resistance after ageing [kΩ] |
|---|---|---|---|
| 12 | naphthalene-2-sulfonic acid | 25 | 180 |
| 13 | p-toluene sulfonic acid | 25 | 150 |
| 14 | pyridine-3-sulfonic acid | >500 | >20,000 |
| 15 | trifluoromethane sulfonic acid | 80 | 200 |
| 16 | polystyrene sulfonic acid | 10 | 130 |
| 17 | polystyrene sulfonic acid-co-maleic acid | >500 | >20,000 |

TABLE 4

(Test results)

| Example | Permanganate bath | Monomer bath | Electroplating time electrolytic Cu-plating [min] | Transmitted light test *) | Resistance [kΩ] |
|---|---|---|---|---|---|
| 1 | P1 | M1 | 2 | D10 | 15 |
| 2 | P1 | M2 | 2 | D10 | 25 |
| 3 | P1 | M3 | 2 | D10 | 10 |
| 4 | P1 | M4 | 2 | D7 | 130 |
| 5 | P2 | M2 | 1 | D10 | 2 |
| 6 | P2 | M4 | 1 | D5 | 130 |

*) Test conditions indicated in: Handbuch der Leiterplattentechnik (Manual of Printed Circuit Board Technique), vol. 3, ed. Günther Herrmann, published by Eugen G. Leuze, Germany, pages 72, 73 (scaling: D10 complete coating coverage on the wall of the hole, D5: substantial regions (more specifically glass fiber regions) are not covered with copper, D1: the wall of the hole is hardly covered at all)

TABLE 6

(Treatment times)

| | Immersion technique | Horizontal technique |
|---|---|---|
| A) Desmear process | | |
| a) Swelling | 0–10 min | 0–4 min |
| b) Etching in permanganate solution | 4–20 min | 2–8 min |
| c) Removing manganese dioxide | 1–6 min | 30 sec–2 min |
| B) Pre-treating | | |
| d) Cleaning by etching | 3–6 min | 30 sec–2 min |
| C) Producing the conductive polymer layer | | |
| e) Conditioning | 2–6 min | 15 sec–2 min |
| f) Forming manganese dioxide | 2–6 min | 1–3 min |
| g) Forming the conductive polymer | 2–6 min | 1–3 min |

TABLE 7

(Temperature stability of microemulsions)

| Example | Surfactant I Number of EO-groups | Concentration [% by weight] surfactant I | Surfactant II Number of EO-groups | Concentration [% by weight] surfactant II | Temperature range |
|---|---|---|---|---|---|
| 18 | 20 | 15 | — | — | −10° C. through +32° C. |
| 19 | 25 | 15 | — | — | 0° C. through +45° C. |
| 20 | 40 | 15 | — | — | +15° C. through +60° C. |
| 21 | 20 | 3.6 | 40 | 11.4 | −5° C. through +52° C. |
| 22 | 25 | 4.8 | 40 | 10.2 | −5° C. through +52° C. |
| 23 | 16 | 6.9 | 60 | 8.1 | −5° C. through +52° C. |

The invention claimed is:

1. Method for the direct electrolytic metallization of electrically non-conducting substrates, comprising:
   a. bringing the substrate surfaces into contact with a water soluble polymer;
   b. treating the substrate surfaces with a permanganate solution after contacting the substrate surfaces with the water soluble polymer of step a;
   c. after treating of the substrate surfaces with the permanganate solution in step b, treating the substrate surfaces with an acidic aqueous solution
      or an acidic microemulsion of aqueous base containing at least one thiophene compound and at least one alkane sulfonic acid selected from the group consisting of methane sulfonic acid, ethane sulfonic acid and ethane disulfonic acid; and
   d. electrolytically metallizing the substrate surfaces after treating the substrate surfaces in step c.

2. The method of claim 1, wherein, the permanganate solution is acidic.

3. The method of claim 2, wherein, the permanganate solution is adjusted to a pH ranging from 3.5 to 5.

4. The method of claim 1, wherein, the permanganate solution is adjusted to a pH ranging from 2.5 to 7.

5. The method of claim 1, wherein, the permanganate solution comprises at least one buffer compound for adjusting the pH-value, said buffer compound being selected from the group consisting of phosphoric acid, dihydrogen phosphate and hydrogen phosphate.

6. The method of claim 1, wherein, the permanganate solution comprises at least one buffer compound for adjusting the pH-value, said buffer compound being selected from the group consisting of boric acid and borate.

7. The method of claim 1, wherein, the at least one alkane sulfonic acid is methane sulfonic acid.

8. The method of claim 1, wherein, by adjusting the concentration of the at least one alkane sulfonic acid, the pH of the solution or microemulsion is in the range of 0 to 3.

9. The method of claim 1, wherein, by adjusting the concentration of the at least one alkane sulfonic acid, the pH of the solution or microemulsion is in the range of 1.5 to 2.1.

10. The method of claim 1, wherein, the at least one thiophene compound is selected from the group consisting of 3-heterosubstituted thiophenes and 3,4-diheterosubstituted thiophenes.

11. The method of claim 1, wherein, the at least one thiophene compound is selected from the group consisting of 3,4-ethylene dioxythiophene, 3-methoxy thiophene, 3-methyl-4-methoxy thiophene and the derivatives thereof.

12. The method of claim 1, wherein, said solution or microemulsion furthermore contains at least one surfactant.

13. The method of claim 12, wherein the at least one surfactant is an ethoxylate surfactant.

14. The method of claim 1, wherein, said solution or microemulsion furthermore contains at least one salt of the at least one alkane sulfonic acid.

15. The method of claim 1, wherein, the substrate surfaces are electrolytically copper-plated in method step d.

16. Method for the direct electrolytic metallization of electrically non-conducting substrates, comprising:
   a. bringing the substrate surfaces into contact with a water soluble polymer;
   b. treating the substrate surfaces with a permanganate solution after contacting the substrate surfaces with the water soluble polymer of step a;
   c. after treating of the substrate surfaces with the permanganate solution in step b,
      treating the substrate surfaces with an acidic aqueous solution or an acidic microemulsion of aqueous base containing at least one thiophene compound and at least one alkane sulfonic acid selected from the group consisting of methane sulfonic acid, ethane sulfonic acid and ethane disulfonic acid; and
   d. electrolytically metallizing the substrate surfaces after treating the substrate surfaces in step c;
   e. wherein the permanganate solution is adjusted to a pH ranging from 2.5 to 7; and
   f. wherein the permanganate solution comprises at least one buffer compound for adjusting the pH-value, said buffer compound being selected from the group consisting of phosphoric acid, dihydrogen phosphate and hydrogen phosphate;
   g. wherein the at least one alkane sulfonic acid is methane sulfonic acid;
   h. wherein said solution or microemulsion furthermore contains at least one surfactant; and
   i. wherein the at least one surfactant is an ethoxylate surfactant.

17. Method for the direct electrolytic metallization of electrically non-conducting substrates, comprising:
   a. bringing the substrate surfaces into contact with a water soluble polymer;
   b. treating the substrate surfaces with a permanganate solution after contacting the substrate surfaces with the water soluble polymer of step a;
   c. after treating of the substrate surfaces with the permanganate solution in step b,
      treating the substrate surfaces with an acidic aqueous solution or an acidic microemulsion of aqueous base containing at least one thiophene compound and at least one alkane sulfonic acid selected from the group consisting of methane sulfonic acid, ethane sulfonic acid and ethane disulfonic acid; and d. electrolytically metallizing the substrate surfaces after treating the substrate surfaces in step c;

e. wherein the permanganate solution is adjusted to a pH ranging from 2.5 to 7; and f. wherein the at least one thiophene compound is selected from the group consisting of 3-heterosubstituted thiophenes and 3,4-diheterosubstituted thiophenes.

18. The method of claim 17, wherein said solution or microemulsion furthermore contains at least one surfactant.

19. The method of claim 17, wherein said solution or microemulsion furthermore contains at least one salt of the at least one alkane sulfonic acid.

20. Method for the direct electrolytic metallization of electrically non-conducting substrates, comprising:

a. bringing the substrate surfaces into contact with a water soluble polymer;

b. treating the substrate surfaces with a permanganate solution after contacting the substrate surfaces with the water soluble polymer of step a;

c. after treating of the substrate surfaces with the permanganate solution in step b, treating the substrate surfaces with an acidic aqueous solution or an acidic microemulsion of aqueous base containing at least one thiophene compound and at least one alkane sulfonic acid selected from the group consisting of methane sulfonic acid, and ethane sulfonic acid and ethane disulfonic acid;

d. electrolytically metallizing the substrate surfaces after treating the substrate surfaces in step c;

e. wherein the permanganate solution comprises at least one buffer compound for adjusting the pH-value, said buffer compound being selected from the group consisting of boric acid and borate; and f. wherein by adjusting the concentration of the at least one alkane sulfonic acid, the pH of the solution or microemulsion is in the range of 0 to 3.

* * * * *